United States Patent [19]

Tokunaga et al.

[11] 4,084,222
[45] Apr. 11, 1978

[54] HIGH-VOLTAGE POWER SUPPLY DEVICE

[75] Inventors: Norikazu Tokunaga; Kohei Yabuno, both of Hitachi, Japan

[73] Assignee: Hitachi, Ltd., Japan

[21] Appl. No.: 727,692

[22] Filed: Sep. 28, 1976

[30] Foreign Application Priority Data

Oct. 3, 1975    Japan .................... 50-118878

[51] Int. Cl.² ............................................. H02M 7/00
[52] U.S. Cl. .................................... 363/60; 307/51; 307/242
[58] Field of Search ............... 307/51, 240, 241, 242; 321/2, 15, 43, 44, 45 C; 315/160; 363/59, 60, 135

[56] References Cited

U.S. PATENT DOCUMENTS

| | | | |
|---|---|---|---|
| 3,621,362 | 11/1971 | Schwarz | 321/15 X |
| 3,873,846 | 3/1975 | Morio et al. | 321/2 X |
| 3,978,346 | 8/1976 | Iwata | 307/51 |
| 3,984,751 | 10/1976 | Iwata et al. | 321/45 C |

*Primary Examiner*—William M. Shoop
*Attorney, Agent, or Firm*—Craig & Antonelli

[57] ABSTRACT

A high-voltage power supply device comprising a first DC power source, a first reactor supplied with direct current from this first DC power source, a resistor connected in parallel with the first reactor, a current interrupter initially permitting circulation of the flow of current between it and the first reactor and subsequently interrupting the flow of the circulating current therethrough, at least one auxiliary reactor connected in parallel with the first reactor, a second DC power source supplying direct current to the auxiliary reactor, an auxiliary current interrupter initially permitting circulation of the flow of current between it and the auxiliary reactor and subsequently interrupting the flow of the circulating current therethrough, and a diode and switch means connected between the first reactor and the auxiliary reactor. This switch means is turned off when the direct current is supplied to the first reactor from the first DC power source and turned on when the current is supplied to the first reactor from the auxiliary reactor. The high voltage appearing across the resistor in response to the interruption of the flow of the current circulating through the first reactor and the current interrupter is taken up by the diode and is not applied to the auxiliary reactor and the auxiliary current interrupter, so that the auxiliary reactor and the auxiliary current interrupter can be prevented from being destroyed by the high voltage.

10 Claims, 5 Drawing Figures

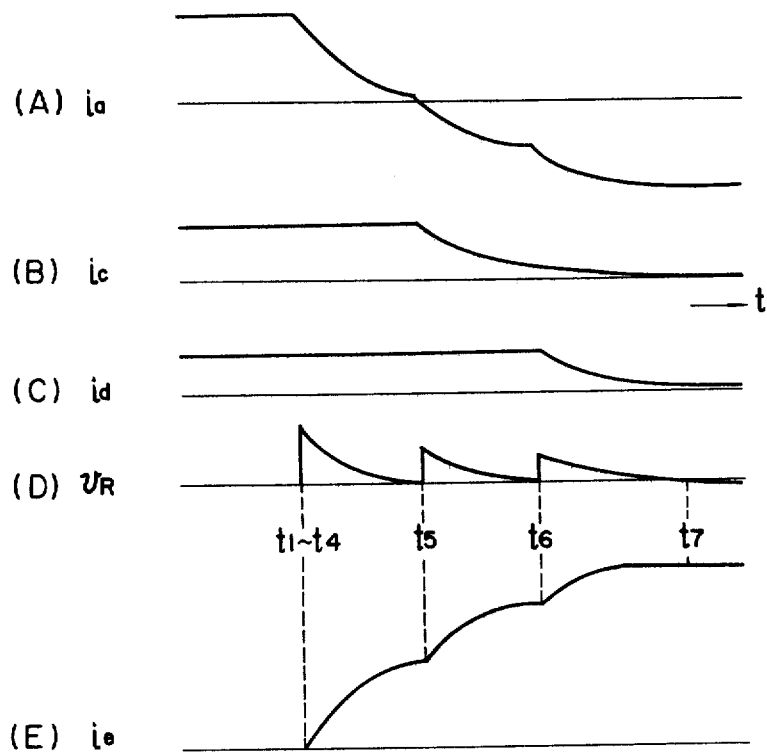
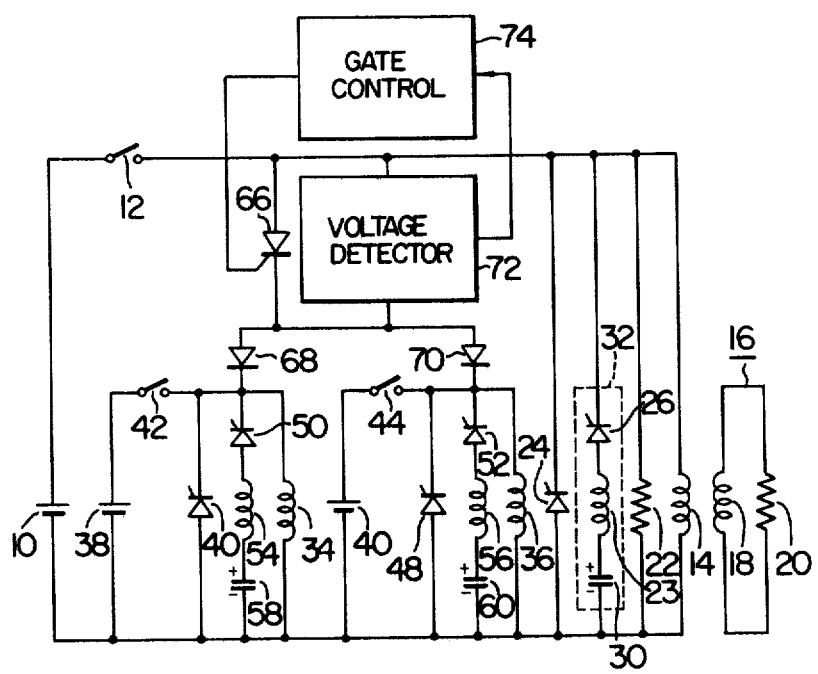

HIGH-VOLTAGE POWER SUPPLY DEVICE

BACKGROUND OF THE INVENTION

1. Field of the Invention

This invention relates to high-voltage power supply devices, and more particularly to a device of the kind of above described which utilizes the energy accumulating in a plurality of inductive circuits for the generation of a high voltage.

2. Description of the Prior Art

In copending U.S. Pat. application Ser. No. 517,744 and now U.S. Pat. No. 3,984,751 filed on Oct. 24, 1974 by inventors Iwata et al, entitled "High D.C. Voltage Generating Apparatus" and assigned to the same assignee as that of the present application, a power supply device is disclosed in which an inductive circuit and a resistor are connected in parallel with each other, and direct current is supplied to the resistor after having continuously supplied the direct current to the inductive circuit, thereby generating a high DC voltage across the resistor for applying this high voltage to the inductive circuit.

While the copending application relates to a power supply device adapted for generating a high voltage in an inductive circuit, another power supply device of the type above described may be required in which such an inductive circuit is magnetically coupled to a load circuit for supplying a large current to the load circuit. In such a power supply device, it is required to increase the energy accumulation in the inductive circuit by enlarging the accumulating capacity of the inductive circuit for increasing the amount of the direct current. The increase in the energy accumulation in the inductive circuit results in the corresponding increase in the electromagnetic force produced in the inductive circuit, and the inductive circuit is required to possess a very high strength sufficient to withstand the increased electromagnetic force. Further, the increase in the amount of the direct current supplied to the inductive circuit requires the corresponding increase in the capacity of current interrupter means by which the current supplied to the inductive circuit is permitted to flow through the resistor. Furthermore, the increase in the amount of the direct current results in increased power losses in the circuit.

With a view to obviate such disadvantages of a power supply device of this kind, it has been considered to modulate the device to include a plurality of reactors (inductive circuits) so that the energy accumulated in these reactors can be successively discharged for supplying a large current to a load circuit. However, this modulation makes the power supply system very complex in circuit structure compared with conventional power supply devices of this kind. Further, in the course of the successive discharge of the energy accumulating in the plural reactors, the high voltage generated upon interruption of power supply from a power source to one of the reactors tends to be applied to the remaining reactors and to the power supply circuits and interrupting means associated with the latter reactors. Furthermore, various limitations pertinent to circuit constants and characteristics of switches and other circuit elements make it difficult to attain the required successive interruption of the power supply from the power source for supplying the energy to the load circuit within a relatively short period of time required by the load circuit.

SUMMARY OF THE INVENTION

It is a general object of the present invention to provide a novel and improved high-voltage power supply device which includes a plurality of energy accumulating reactors capable of supplying a large current to a load circuit.

Another object of the present invention is to provide a high-voltage power supply device of the above character in which means are provided so that the high voltage, which is generated when the current supplied to one of the reactors is caused to flow through a resistor, is prevented from being applied to the remaining reactors and to the current interrupting means provided for the commutation of the circulating current circulating through the associated reactors.

Still another object of the present invention is to provide a high-voltage power supply device of the above character in which the current interrupting means for commutating the circulating current circulating through the associated reactors can be easily controlled.

In accordance with one aspect of the present invention, there is provided a high-voltage power supply device comprising first direct current supply means, a first reactor connected to said first direct current supply means for accumulating the energy of power, a resistor connected in parallel with said first reactor, first switching means turned off for interrupting the flow of direct current therethrough while the direct current is being supplied to said first reactor, a load circuit coupled magnetically to said first reactor, at least one second reactor connected in parallel with said first reactor for supplying to said load circuit the energy accumulating therein after the energy accumulating in said first reactor has been supplied to said load circuit, second direct current supply means for supplying direct current to said second reactor, second switching means turned off for interrupting the flow of direct current therethrough while the direct current is being supplied to said second reactor, on-off means connected between said first reactor and said second reactor to be turned off when the current is supplied to said first reactor from said first direct current supply means and turned on when the current is supplied to said first reactor from said second reactor, and a diode connected between said on-off means and said second reactor. According to the present invention, therefore, a large current can be supplied to the load circuit by sequentially turning off the first and second switching means associated respectively with the first and second reactors.

The diode acts to take up the high voltage appearing across the resistor as a result of the flow of the energy accumulating in the first reactor through the resistor. Therefore, this high voltage is not applied across the second reactor and associated switching elements, and the breakdown voltage rating of these elements need not be increased to the level required to withstand the high voltage.

BRIEF DESCRIPTION OF THE DRAWINGS

FIGS. 2 and 3 show waveforms of operating currents and voltages, as designated, in the circuit of FIG. 1 and FIG. 2 shows a part of FIG. 3 in more detail.

FIG. 4 is a circuit diagram of another preferred embodiment of the present invention.

DESCRIPTION OF THE PREFERRED EMBODIMENTS

Figure 1:
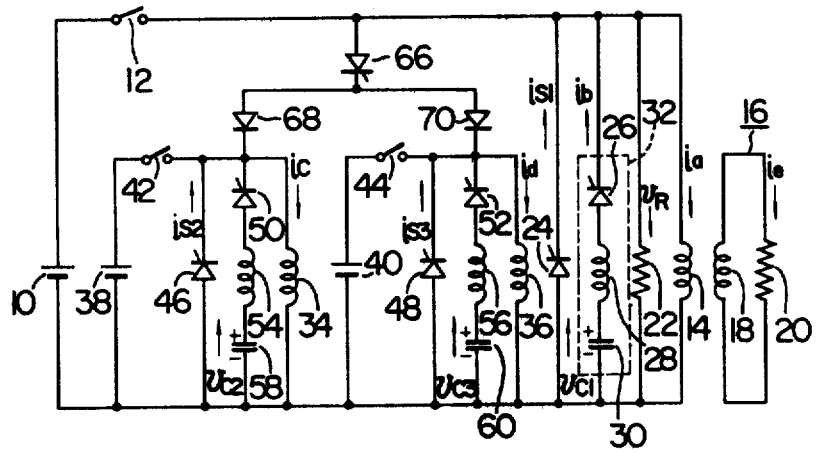
FIG. 1 is a circuit diagram of a preferred embodiment of the high-voltage power supply device according to the present invention.

Referring now to FIG. 1 showing a preferred embodiment of the high-voltage power supply device according to the present invention, a DC power source 10 is connected through a switch 12 to a reactor 14 to supply direct current to the reactor 14. This DC power source 10 may comprise a bridge circuit of controlled rectifiers connected at the input terminals thereof to an AC power source, and this rectifier is preferably of the type capable of acting as an inverter. A load circuit 16 is coupled magnetically to the reactor 14. This load circuit 16 is equivalently illustrated as comprising a reactor 18 and a resistor 20 as shown. A resistor 22 is connected in parallel with the reactor 14. A thyristor 24 is connected to the reactor 14, and a commutation circuit 32 comprising an auxiliary thyristor 26, an auxiliary reactor 28 and a capacitor 30 is provided for interrupting the flow of current through the thyristor 24.

Figure 2:
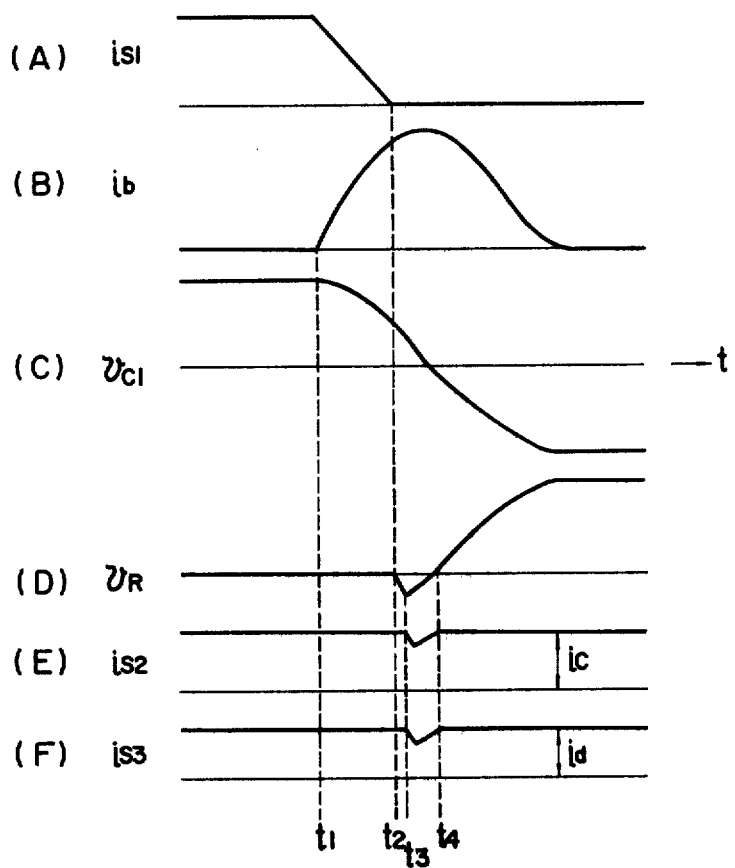

Reactors 34 and 36 are connected in parallel with the reactor 14. These reactors 34 and 36 are respectively connected to DC power sources 38 and 40 similar to the DC power source 10 through switches 42 and 44, and thyristors 46 and 48 are respectively connected to the reactors 34 and 36. Commutation circuits comprising auxiliary thyristors 50, 52, auxiliary reactors 54, 56, and capacitors 58, 60 are respectively provided for interrupting the flow of current through these thyristors 46 and 48. Another thyristor 66 and a pair of diodes 68 and 70 are connected between the reactor 14 and the respective reactors 34 and 36. The operation of the high-voltage power supply device embodying the first form of the present invention having such a structure will be described with reference to FIGS. 1 and 2. In operation, direct current is supplied to the reactor 14 from the DC power source 10, and a gate signal is applied to the gate of the thyristor 24 while the direct current is being supplied to the reactor 14. Then, when the power supply voltage of the DC power source 10 is reduced or the polarity thereof is inverted, the current flowing from the DC power source 10 to the reactor 14 circulates now between the thyristor 24 and the reactor 14. The switch 12 is turned off at the time at which the current value flowing through the switch 12 is sufficiently decreased or reduced to zero. While the circulating current is flowing through the thyristor 24 and the reactor 14, the thyristor 24 is turned off, and the auxiliary thyristor 26 is turned on in turn. The capacitor 30 is previously charged in the illustrated polarity by another DC power source (not shown). At time $t_1$, an oscillating current $i_b$ as shown in FIG. 2(B) starts to flow through the oscillatory circuit including the auxiliary reactor 28 and the capacitor 30, and the current $i_{s1}$ flowing through the thyristor 24 is finally reduced to zero as shown in FIG. 2(A) with the turn-off of the thyristor 24. As a result, the current $i_{s1}$ having been flowing through the thyristor 24 flows now through the circuit including the resistor 22 to produce a high voltage across the reactor 14, and the change in the current flowing through the reactor 14 produced flow of a current through the load circuit 16 coupled magnetically to the reactor 14.

The operation of the entire device will be described in detail with further reference to FIG. 3.

The DC power sources 10, 38 and 40 are respectively connected through the switches 12, 42 and 44 to the reactors 14, 34 and 36 in a polarity as shown in FIG. 1 to supply currents $i_a$, $i_c$ and $i_d$ as shown in FIGS. 3(A), 3(B) and 3(C) to the respective reactors 14, 34 and 36. At this time, the thyristor 66 is maintained in the off state to prevent flow of the current from the power source 10 into the reactors 34 and 36. When the current values flowing through the reactors 14, 34 and 36 attain predetermined settings, the polarities of the individual power sources 10, 38 and 40 are inverted by, for example, changing the conduction angles of the controlled rectifiers so as to operate the rectifiers as inverters, and at the same time, the thyristors 24, 46 and 48 are turned on so that the currents from the respective power sources 10, 38 and 40 start to flow through the thyristors 24, 46 and 48. At the same time, the switches 12, 42 and 44 are turned off.

Subsequently, the auxiliary thyristor 26 is turned on to permit flow of the current $i_b$ shown in FIG. 2B through the closed circuit including the auxiliary reactor 28, the auxiliary thyristor 26 and the reactor 14. In this case, the power source is the capacitor 30 which has previously been charged with a voltage $v_{cl}$ as shown in FIG. 2(C) in the polarity illustrated in FIG. 1 by the DC power source (not shown). This voltage $v_{cl}$ charged in the capacitor 30 varies in a manner as shown in FIG. 2(C) with the discharge. The auxiliary thyristor 26 is then turned off. The current $i_a$ flowing through the reactor 14 flows through the resistor 22 to produce a voltage $V_R$ as shown in FIG. 3(D) and FIG. 2(D) which shows variation during $t_1 \sim t_4$ in FIG. 3(D) in more detail. Simultaneously a voltage is induced in the load circuit 16 coupled magnetically to the reactor 14, and a current $i_e$ as shown in FIG. 3(E) flows through the load circuit 16.

The circuit operation during the turn-off of the thyristor 24 will be described in more detail. At time $t_2$, the current $i_{s1}$ flowing through the thyristor 24 is finally reduced to zero as shown in FIG. 2A, and the thyristor 24 is turned off. At this time $t_2$, an inverted voltage $v_R$ as shown in FIG. 2D appears across the resistor 22, and this voltage $v_R$ is applied to the thyristor 66 as a forward voltage. The breakdown voltage rating of the thyristor 66 need not be high since this voltage $v_R$ is low. The thyristor 66 is turned on at time $t_3$ at which the applied voltage attains a predetermined level. Generally, an appreciable change does not occur in the current flowing through the reactors 34 and 36 due to the large inductance of the reactors 34 and 36. Therefore, in response to the turn-on of the thyristor 66, the voltage $v_R$ appearing across the resistor 22 provides flow of currents $i_{s2}$ and $i_{s3}$ through the thyristors 46 and 48 through the respective diodes 68 and 70. The currents $i_{s2}$ and $i_{s3}$ flowing respectively through the thyristors 46 and 48 are suppressed by the impedances of the circuits including these thyristors 46 and 48 so that they decrease in a manner as shown in FIGS. 2(E) and 2(F). However, due to the fact that the voltage $v_R$ appearing across the resistor 22 turns to become positive again as shown in FIG. 2(D), the values of the currents $i_{s2}$ and $i_{s3}$ increase again to beome equal to those of the currents $i_c$ and $i_d$ flowing through the reactors 34 and 36 respectively. The voltage $v_R$ appearing between time $t_4$ and time $t_5$ in FIG. 3(D) is taken up by the diodes 68 and 70.

As the energy accumulating in the reactor 14 decreases with the discharge, the reactor 34 starts to discharge the energy accumulating therein. At time $t_5$, the auxiliary thyristor 50 is turned on, and the voltage charged in the capacitor 58 provides a flow of current of inverted polarity to the thyristor 46 to turn off the same. After the thyristor 46 is turned off, the auxiliary thyristor 50 is turned off. Consequently, the current $i_c$ flowing through the reactor 34 is supplied through the thyristor 66 and the diode 68 to the reactor 14. Thus, an abrupt change does not occur in the current $i_a$ flowing through the reactor 14, and the difference between the current $i_c$ and the current $i_a$ flows through the resistor 22. The voltage $v_R$ appears across the resistor 22 between time $t_5$ and time $t_6$ shown in FIG. 3(D), and the energy accumulating in the reactor 34 supplies power to the load circuit 16 coupled magnetically to the reactor 14. The voltage applied across the thyristor 46 is approximately equal to the voltage $v_R$ appearing across the resistor 22 between time $t_5$ and time $t_6$.

The energy accumulating in the reactor 36 is discharged in a manner entirely similar to the manner of discharge of the energy from the reactor 34. At time $t_6$, the auxiliary thyristor 52 is turned on, and the thyristor 48 is turned off. As a result, the difference between the current $i_d$ in the reactor 36 and the current $i_a$ in the reactor 14 is applied to the resistor 22, and the voltage $v_R$ appears across the resistor 22 between time $t_6$ and time $t_7$ shown in FIG. 3(D).

The circuit operation above described produces flow of the current $i_e$ shown in FIG. 3(E) through the load circuit 16. At time $t_7$ shown in FIGS. 3(D) and 3(E), the current $i_e$ attains its maximum level, and the voltage across the resistor 22 is reduced to zero. At this time $i_7$, the switch 12 is turned on to supply the required current to the reactor 14 from the DC power source 10, so that the energy supplied to the load circuit 16 can be controlled to maintain the current $i_e$ at the desired setting.

The device according to the present invention having the structure above described is advantageous in that the circuit arrangement eliminates the supply of large current solely to the reactor 14, and this is effective in alleviating the mechanical stress imparted to this reactor and reducing circuit losses. The present invention is further advantageous in that any control means need not be provided for the thyristor 66, and the energy can be discharged from the individual reactors 14, 34 and 36 within a short period of time due to the fact that the thyristor 66 is adapted to be turned on in response to the application of a predetermined voltage thereacross. The present invention is further advantageous in that any high voltage is not applied to the reactors 34 and 36 and the thyristors 46, 48 and 66 in their off state and they need not have a high breakdown voltage rating due to the unique circuit arrangement in which the diodes 68 and 70 are used to take up the high voltage appearing across the resistor 22 connected in parallel with the reactor 14.

FIG. 4 shows another embodiment of the present invention. Actually, the embodiment shown in FIG. 4 is a partial modification of the device shown in FIG. 1. Referring to FIG. 4, the modification comprises a voltage detector 72 which detects the voltage applied across the thyristor 66, and a controller 74 which applies the gate signal to the gate of the thyristor 66 in response to the application of the output of the voltage detector 72. In the device described with reference to FIG. 1, the thyristor 66 is turned on automatically when the applied voltage attains a predetermined level. The device shown in FIG. 4 differs from that of FIG. 1 in that the voltage detector 72 detects the voltage applied across the thyristor 66, and when this voltage attains a predetermined level, applies its output to the controller 74 thereby applying the gate signal to the gate of the thyristor 66 to turn on the same. Thus, the thyristor 66 can be turned on reliably when the applied voltage attains the predetermined level.

The voltage appearing across the resistor 22 may be detected by a suitable detector so as to apply the gate signal to the gate of the thyristor 66 to turn on the same at the required timing. Further, the arrangement of the device may be such that the gate signal is applied to the gate of the thyristor 66 to turn on the same upon lapse of a predetermined length of time after the turn-on of the auxiliary thyristor 26.

Figure 5:
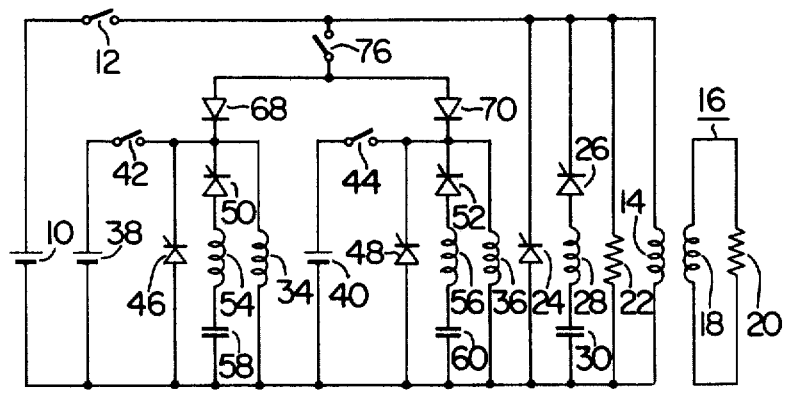
FIG. 5 is a circuit diagram of still another preferred embodiment of the present invention.

FIG. 5 shows still another embodiment of the present invention. This embodiment is also a partial modification of the device shown in FIG. 1, and the thyristor 66 in FIG. 1 is replaced by a simple switch 76. This switch 76 is kept turned off while the switch 12 is turned on to permit supply of the power from the DC power source 10 to the reactor 14. The switch 76 is arranged to be turned on after the time $t_4$ in FIG. 2 and before the time $t_5$ in FIG. 3. Any detailed description of the operation of the device shown in FIG. 5 is not given herein since the remaining parts operate in entirely the same manner as those shown in FIG. 1. The switch 76 in FIG. 5 is turned on at the timing above described. This switch 76 is therefore required to withstand the voltage appearing when the auxiliary thyristor 26 is turned on to interrupt the flow of current through the thyristor 24. However, the embodiment shown in FIG. 5 is less expensive than the embodiment shown in FIG. 1, since the thyristor 66 in FIG. 1 is replaced by the inexpensive switch 76. In order that the switch 76 can be actuated at the aforementioned predetermined timing, the embodiment shown in FIG. 5 requires control means (not shown) for controlling the turn-on timing of the switch 76, and its operation may become slightly complex.

In the embodiment shown in FIG. 1, a temporary abrupt drop occurs in the currents $i_{s2}$ and $i_{s3}$ flowing through the respective thyristors 46 and 48 between time $t_3$ and time $t_4$ as seen in FIG. 2. However, such temporary abrupt drop does not occur in the embodiment shown in FIG. 5. Further, this embodiment is advantageous in that the voltage applied across the diodes 68 and 70 can be reduced when the turn-on timing of the switch 76 is selected to be as close to the time $t_5$ in FIG. 3.

Although the aforementioned embodiments have been illustrated to include three energy accumulating reactors, the number of such energy accumulating reactors is in no way limited to three, and such reactors may be provided in any suitable number more than and including two. Further, although the aforementioned embodiments have been illustrated to include one thyristor or switch for each set of two reactors, one thyristor or switch may be provided for each individual reactor.

It will be understood from the foregoing detailed description of the present invention that a plurality of reactors are provided to individually supply part of the required energy so that the mechanical stress can be alleviated and circuit losses can be reduced by virtue of the reduction in the current value supplied to the individual reactors. The present invention is further advantageous in that the limitations pertinent to the circuit constants and the characteristics of the circuit elements can be eliminated, and the desired circuit operation can be easily carried out within a short period of time, due to the fact that the individual switches can be turned off substantially simultaneously. The present invention provides such an additional advantage that the thyristors need not have a high breakdown voltage rating due to the fact that the high voltage appearing during the discharge of the energy from anyone of the reactors is not applied to the remaining thyristors which are not in the turn-on state.

We claim:

1. A high-voltage power supply device comprising first direct current supply means, a first reactor connected to said first direct current supply means for accumulating energy therefrom, a resistor connected in parallel with said first reactor, first switching means for interrupting the flow of direct current supplied to said first reactor, a load circuit coupled magnetically to said first reactor, means including at least one second reactor connected in parallel with said first reactor for supplying to said load circuit the energy accumulating therein after the energy accumulating in said first reactor has been supplied to said load circuit, second direct current supply means for supplying direct current to said second reactor, second switching means for interrupting the flow of direct current supplied to said second reactor, third switching means connected between said first reactor and said second reactor to be turned off when the current is supplied to said first reactor from said first direct current supply means and turned on when the current is supplied to said first reactor from said second reactor, and a diode connected between said third switching means and said second reactor.

2. A high-voltage power supply device as claimed in claim 1, wherein said third switching means comprises a thyristor which is turned on when a predetermined voltage is applied thereacross.

3. A high-voltage power supply means as claimed in claim 1, wherein said third switching means comprises a switch which is turned on after said first switching means has turned off to interrupt the flow of the direct current therethrough.

4. A high-voltage power supply device as claimed in claim 1, wherein a plurality of said second reactors are connected in common to said third switching means, and said diode is provided for each of said second reactors.

5. A high-voltage power supply device comprising first direct current supply means, a first reactor connected to said first direct current supply means for accumulating energy therefrom, a resistor connected in parallel with said first reactor, first switching means connected in parallel with said first reactor to be turned on for initially permitting circulation of the flow of current between it and said first reactor and subsequently turned off for interrupting the flow of the circulating current therethrough, a load circuit coupled magnetically to said first reactor, a plurality of second reactors connected in parallel with said first reactor for supplying to said load circuit the energy accumulating therein after the energy accumulating in said first reactor has been supplied to said load circuit, a plurality of second direct current supply means for supplying direct current to said second reactors respectively, a plurality of second switching means connected respectively in parallel with said second reactors to be turned on for initially permitting circulation of the flow of current between them and the associated ones of said second reactors and subsequently turned off for interrupting the flow of the circulating current therethrough, a plurality of diodes connected respectively to said second reactors at one terminal thereof in a direction which permits discharge of the energy accumulating in said second reactors, and third switching means connected in common between the other terminal of said diodes and one terminal of said first reactor to be turned off when the current is supplied to said first reactor from said first direct current supply means and turned on when the current is supplied to said first reactor from said second reactors.

6. A high-voltage power supply device as claimed in claim 5, wherein said third switching means comprises a thyristor which is turned on when a predetermined voltage is applied thereacross.

7. A high-voltage power supply means as claimed in claim 5, wherein said third switching means comprises a switch which is turned on after said first switching means has been turned off to interrupt the flow of the direct current therethrough.

8. A high-voltage power supply device comprising first direct current supply means; a first reactor; a first switch connected in series with said first direct current supply means across said first reactor; a resistor connected in parallel with said first reactor; a load circuit coupled magnetically to said first reactor; a first thyristor connected in parallel with said first reactor; a first commutating circuit including a first capacitor, a second reactor and a second thyristor connected in series across said first reactor; a diode; a third reactor; switching means connected in series with said diode and said third reactor across said first reactor; second direct current supply means; a second switch connected in series with said second direct current supply means across said third reactor; a third thyristor connected in parallel with said third reactor; and a second commutating circuit including a second capacitor, a fourth reactor and a fourth thyristor connected in series across said third reactor.

9. A high-voltage power supply device as claimed in claim 8, wherein said switching means comprises a thyristor which is turned on when a predetermined voltage is applied thereacross.

10. A high-voltage power supply means as claimed in claim 8, wherein said switching means comprises a switch which is turned on after said first switching means has been turned off to interrupt the flow of the direct current therethrough.

* * * * *